United States Patent [19]

Alferness et al.

[11] Patent Number: 4,751,555
[45] Date of Patent: Jun. 14, 1988

[54] SEMICONDUCTOR HETEROINTERFACE OPTICAL WAVEGUIDE

[75] Inventors: Rodney C. Alferness, Holmdel; Andrew G. Dentai, Atlantic Highlands; Charles H. Joyner, Jr., Middletown, all of N.J.

[73] Assignee: American Telephone and Telegraph Company, AT&T Bell Laboratories, Murray Hill, N.J.

[21] Appl. No.: 48,286

[22] Filed: May 11, 1987

[51] Int. Cl.[4] .......................................... H01L 29/161
[52] U.S. Cl. ......................................... 357/16; 357/30
[58] Field of Search ...................... 357/16, 30 B, 30 E

[56] References Cited

U.S. PATENT DOCUMENTS

| | | | |
|---|---|---|---|
| 4,323,911 | 4/1982 | Campbell | 357/30 E |
| 4,390,889 | 6/1983 | Capasso | 357/30 E |
| 4,546,479 | 10/1985 | Ishikawa | 357/16 |
| 4,625,226 | 11/1986 | Antell | 357/30 E |
| 4,631,566 | 12/1986 | Campbell | 357/16 |

*Primary Examiner*—Martin H. Edlow
*Attorney, Agent, or Firm*—Gregory C. Ranieri

[57] ABSTRACT

Low loss semiconductor waveguides for supporting propagation of optical signals over a wide range of wavelengths are achieved by growing at least two epitaxial layers of dopant material contiguous along a major surface of each layer to form a heterointerface therebetween. At least one of the epitaxial layers includes a sufficient concentration of semiconductor material to cause strain via lattice mismatch substantially at and near the heterointerface. The strain induces a change in refractive index such that the heterointerface exhibits a substantially higher refractive index than a portion of each epitaxial layer proximate to the heterointerface. The resulting waveguide is capable of supporting propagation of optical signals substantially along the heterointerface. In one example, contiguous epitaxial layers of InP and InGaP form a waveguide for optical signals at wavelengths greater than 0.93 $\mu$m. The concentration of Ga in the InGaP epitaxial layer is varied from $10^{18}$ to $10^{20}$ cm$^{-3}$ to increase the refractive index difference between the heterointerface and the immediate surrounding layers.

12 Claims, 2 Drawing Sheets

SEMICONDUCTOR HETEROINTERFACE OPTICAL WAVEGUIDE

TECHNICAL FIELD

This invention relates to semiconductor devices and, more particularly, to semiconductor optical waveguide devices.

BACKGROUND OF THE INVENTION

Semiconductor optical waveguides have been fabricated in the Group III-V systems by cladding an epitaxial layer of high refractive index material with one or more epitaxial or mass transported layers of lower refractive index material.

For example, in the InGaAsP/InP system, a quaternary (InGaAsP) guiding layer is clad with lower index binary (InP) layers to form an optical waveguide. While the As content of the quaternary guiding layer can be raised to increase the refractive index of guiding layer with respect to the cladding layers, this decreases the energy bandgap of the guiding layer and, thereby, increases the cutoff wavelength of the waveguide. As such, the resulting waveguide exhibits a limited transparency range in the window of wavelengths (1.3 to 1.6 $\mu$m.) of interest in lightwave communications. In addition to this limitation, quaternary layers such as InGaAsP are difficult to grow using procedures such as MOVPE because such growth requires precise, stable control of temperatures and flows of precursor materials used in the growth process.

Other techniques have been employed to produce these semiconductor optical waveguides. For example, extremely thin layers of InP and InGaAs have been interleaved to create an "effective" quaternary guiding layer. While this approach is similarly limited with respect to transparency, it introduces a further requirement in the growth process, namely, the need for a manifold capable of switching rapidly between different precursor materials to create abrupt interfaces.

SUMMARY OF THE INVENTION

Low loss semiconductor waveguides for supporting propagation of optical signals over a wide range of wavelengths are achieved, in accordance with the principles of this invention, by growing at least two epitaxial layers of semiconductor material contiguous along a major surface of each layer to form a heterointerface therebetween. At least one of the epitaxial layers includes a sufficient concentration of dopant material to cause strain via lattice mismatch substantially at and near the heterointerface. The strain induces a change in refractive index such that the heterointerface exhibits a substantially higher refractive index than a portion of each epitaxial layer proximate to the heterointerface. The resulting waveguide is capable of supporting propagation of optical signals substantially along the heterointerface.

In one example, contiguous epitaxial layers of InP and InGaP form a waveguide for optical signals at wavelengths greater than 0.93 $\mu$m. The concentration of Ga in the InGaP epitaxial layer is varied from $10^{18}$ to $10^{20}$ cm$^{-3}$ to increase the refractive index difference between the heterointerface and the immediate surrounding layers.

Electrode structures have been utilized in conjunction with the waveguide to produce active waveguide functions such as modulation and switching. Generally, the epitaxial layers in these active waveguides include dopants to make the layers highly resistive or semi-insulating

BRIEF DESCRIPTION OF THE DRAWING

A more complete understanding of the invention may be obtained by reading the following description of specific illustrative embodiments of the invention in conjunction with the appended drawing in which.

DETAILED DESCRIPTION

Semiconductor waveguides as described below include at least two contiguous epitaxial layers grown on a semiconductor substrate and exhibiting a lattice mismatch at the heterointerface defined therebetween. While a specific arrangement of layers is shown in each of the FIGS., it should be understood that the arrangements shown are for descriptive purposes alone and should not, therefore, be interpreted as limiting. For example, the arrangement of layers on any substrate may be sequentially reversed or juxtaposed without departing from the spirit and scope of the invention. It should also be noted that layer dimensions such as thickness and width have not been made to scale in the FIGS. The views of the waveguides depicted in FIGS. 1 through 4 are cross-sectional in a plane transverse to the direction of propagation for optical signals.

Figure 1:
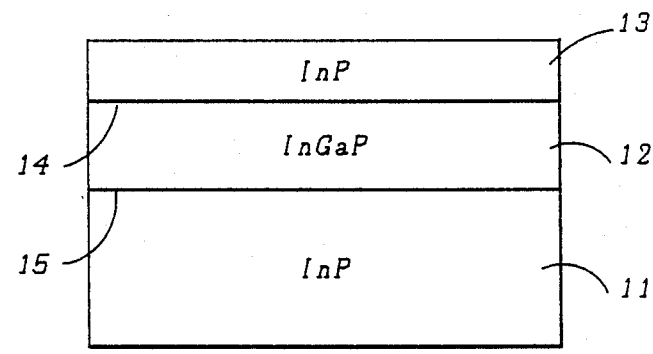
FIG. 1 shows a cross-sectional view of a planar InGaP/InP (two layer) waveguide on an InP substrate.

As shown in FIG. 1, semiconductor waveguide includes two epitaxial layers grown on a semiconductor substrate. Epitaxial layer 12 comprised of InGaP is grown on substrate 11 which is comprised of InP. Epitaxial layer 13 comprised of InP is grown directly on epitaxial layer 12. In the semiconductor waveguide device, heterointerface 14 is created along the surface where epitaxial layer 13 is contiguous with epitaxial layer 12. Similarly, heterointerface 15 is created along the surface where epitaxial layer 12 is contiguous with substrate 11.

In this structure, lattice mismatch occurs at heterointerfaces 14 and 15. The degree of lattice mismatch is primarily dependent upon Ga concentration in epitaxial layer 12 which is controlled to be between $10^{18}$ and $10^{20}$ cm.$^{-3}$. For the range of Ga concentration above, it is possible to produce a lattice mismatch less than 0.2% and, thereby, create an effective refractive index difference of approximately 0.3 or less. The refractive index difference is measured between the heterointerface and regions in each epitaxial layer parallel to the heterointerface and substantially adjacent thereto. Although it is possible to produce even higher refractive index differences by increasing Ga concentration, it is important to avoid increasing Ga concentration beyond the level at which surface morphology is severely disturbed.

Optical signals are guided along and in substantially close proximity to the heterointerface. For the example shown in FIG. 1, it is clear that there are two heterointerfaces and therefore two parallel waveguides. While this is true in theory, it is not the case in practice because there are a high number of defects present generally of the major surface of substrate 11 at heterointerface 15 which contribute to significant optical scattering and loss. Therefore, the waveguide device shown in FIG. 1 is preferably referred to as a single waveguide device at heterointerface 14.

Also, it is important to note that, as stated above, the compositions of epitaxial layers 12 and 13 can be juxtaposed so that the InP epitaxial layer is disposed on substrate 11 and the InGaP epitaxial layer is disposed on the InP epitaxial layer. In this juxtaposed relationship, it is clear that the waveguide structure includes a single heterointerface and is thereby a single waveguide structure.

While any epitaxial growth technique (e.g., MBE, LPE, VPE) may be employed to fabricate the waveguide devices described herein, it should be noted that LPE may unduly limit the length of waveguide device achievable. Using techniques other than LPE offers the potential for growing waveguide devices to the full extent of the semiconductor substrate wafer, that is, at least 2-3 cm. length.

The waveguide shown in FIG. 1 was grown by atmospheric pressure MOVPE in horizontal reactors. For a straight cylindrical reactor with a susceptor heated by rf induction as described in *Electronics Letters*, Vol. 22, pp. 1186 et seq. (1986), typical growth conditions were: carrier gas flow at 8 l/min., trimethylindium flow at $6.7 \times 10^{-5}$ moles/min. and phosphine flow at $9 \times 10^{-3}$ moles/min. Trimethylgallium flow varied from 0 to $3 \times 10^{-7}$ moles/min. Trimethylindium and trimethylgallium bubblers were kept at 10° C. and −15° C., respectively. At a growth temperature of 650° C., the growth rate of InP was 2 μm/hr. For the waveguide shown in FIG. 1, an exemplary thickness for epitaxial layer 13 measured perpendicular to heterointerface 14 was between 0.3 and 2.0 μm., while an exemplary thickness for epitaxial layer 12 was between 2 and 3 μm.

For the waveguide device shown and described above, it has been possible to guide optical signals at 1.32 μm. with a mode width at half maximum intensity of 3.0 μm. Loss at this waveguide has been measured as approximately 1.25 dB/cm.

Figure 2:
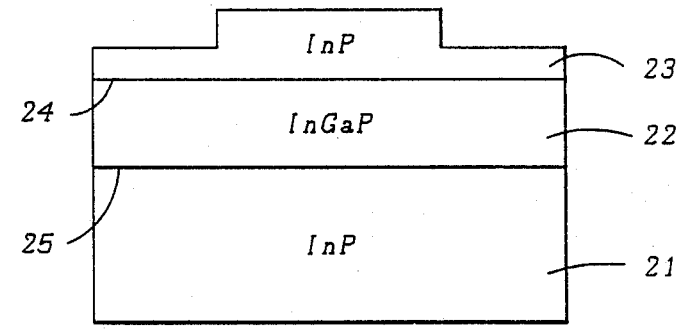
FIG. 2 shows a cross-sectional view of the waveguide of FIG. 1 including a ridge member.

The waveguide device shown in FIG. 2 incorporates a layer structure similar to that shown in FIG. 1. The waveguide is grown directly on substrate 21. Epitaxial layer 22 is grown on substrate 21 creating heterointerface 25 therebetween; epitaxial layer 23 is grown on epitaxial layer 22 creating heterointerface 24 therebetween. A ridge member is included in epitaxial layer 23 to provide lateral confinement (transverse mode control) for optical signals propagating in the waveguide device. For most applications, a ridge member having a lateral dimension between 4 and 20 μm. is sufficient for transverse mode control. The ridge member extends over and parallel to the heterointerface to define the direction of propagation for optical signals in the waveguide. Standard photolithographic and etching techniques known to those skilled in the art are employed in the fabrication of such ridge members. For example, deposition of a silicon nitride mask to define the ridge member followed by appropriate wet (e.g., HCl, bromine methanol) or dry (e.g., plasma) etching step is suitable for fabricating a ridge member.

Figure 3:
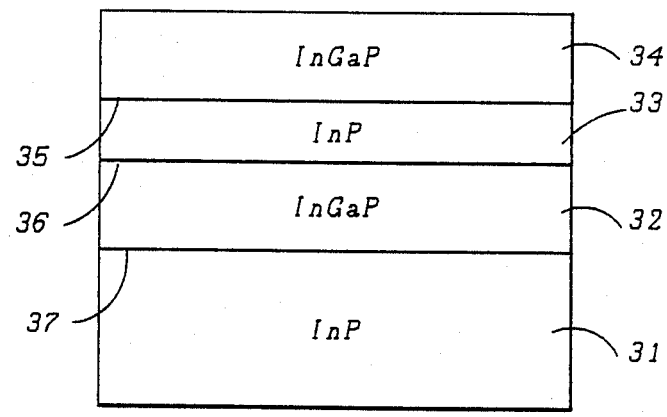
FIG. 3 shows a cross-sectional view of a dual waveguide structure on an InP substrate.

The wavegide device shown in FIG. 3 includes three epitaxial layers (layers 32, 33, and 34) defining two heterointerfaces (35 and 36) therebetween on substrate 31. It should be noted that the composition of the layers may be juxtaposed without affecting the intermediate heterointerface. By properly controlling the thicknesses of epitaxial layers 32, 33, and 34, it is possible to operate the waveguide device shown in FIG. 3 as a vertical coupler in which optical signals propagating along the waveguide defined in the vicinity of heterointerface 35 are coupled into the waveguide defined in the vicinity of heterointerface 36 and vice versa. The degree of coupling is dependent upon the relative separation of the waveguides as well as the degree of transverse mode confinement for each waveguide.

Figure 4:
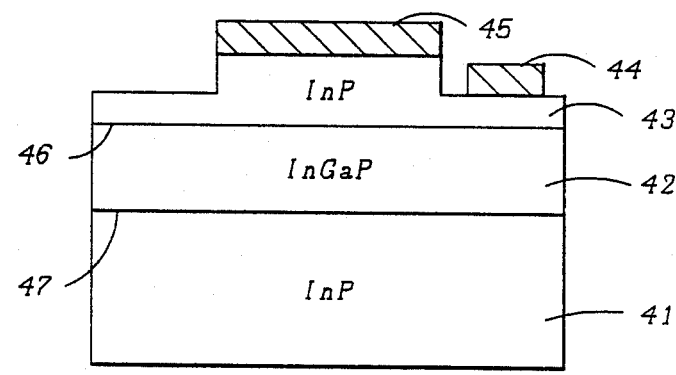
FIG. 4 shows a cross-sectional view of an active waveguide including electrodes disposed on the waveguide shown in FIG. 2.

In contrast to the passive waveguide structures shown in FIGS. 1 through 3, an active waveguide device is shown in FIG. 4. This device incorporates the waveguide structure and ridge member shown in FIG. 2 and includes a pair of electrodes for applying an electric field perpendicular to heterointerface 46. Electrode 45 is disposed directly over the ridge member whereas electrode 44 is disposed adjacent and parallel to the ridge member. By proper selection of the location of these electrodes, it is possible to direct an electric field perpendicular to heterointerface 46 in the region directly under the ridge and electrode 45. While other electrode configurations are applicable to the active waveguide structure in FIG. 4, the configuration shown is preferred because it permits independent electric fields to be applied when the waveguide is incorporated in an integrated optoelectronic circuit with other devices. For the device shown in FIG. 4, it is preferred that the semiconductor layers exhibit highly resistive or semi-insulating properties.

An important feature of the waveguide device shown in FIG. 4 is that the propagation velocities of optical and electrical signals are well matched thereby avoiding the complex electrode structures frequently used for velocity matching in other dielectric waveguide media. Waveguides of the type shown in FIG. 4 are suitable for modulation, multiplexing, demultiplexing and switching applications.

It is understood that the waveguide shown in the FIGS. may be useful as filters by disposing gratings and/or grating resonators on a surface of an epitaxial layer along the direction of optical signal propagation in the waveguide.

What is claimed is:

1. A semiconductor waveguide device comprising a first epitaxial layer including InGaP and a second epitaxial layer including InP, said first epitaxial layer contiguous with said second epitaxial layer along a major surface of each epitaxial layer to form a heterointerface therebetween, said heterointerface and a portion of said first and second epitaxial layers in proximity of said heterointerface for supporting propagation of optical signals substantially along said heterointerface.

2. The device defined in claim 1 wherein said first and second epitaxial layers have a predetermined thickness and said first epitaxial layer has a predetermined gallium concentration to control a refractive index profile of the device about said heterointerface.

3. The device as defined in claim 1 further including means for applying an electric field perpendicular to said heterointerface and substantially along a direction of propagation for said optical signals.

4. The device as defined in claim 1 wherein at least one of said epitaxial layers includes a ridge member aligned substantially along a direction of propagation for said optical signals.

5. The device as defined in claim 4 further including means for applying an electric field perpendicular to said heterointerface and substantially along a direction of propagation for said optical signals.

6. The device as defined in claim 5 wherein said means for applying an electric field further includes first and second electrodes, said first electrode being disposed on and along said ridge member and second electrode being disposed adjacent to said ridge member and substantially parallel to said first electrode.

7. A semiconductor device comprising first and second semiconductor epitaxial layers, said first epitaxial layer being contiguous with said second epitaxial layer along a major surface of each layer to for a heterointerface therebetween, said first epitaxial layer including at least one dopant material for causing strain between said first and second epitaxial layers to induce a refractive index change substantially at and near said heterointerface so that said heterointerface exhibits a substantially higher refractive index than said first and second epitaxial layers in a region substantially proximate said heterointerface.

8. The device as defined in claim 7 wherein said first epitaxial layers includes InGaP and said second epitaxial layer includes InP, said at least one dopant material including gallium.

9. The device as defined in claim 7 further including means for applying an electric field perpendicular to said heterointerface and substantially along a direction of propagation for said optical signals.

10. The device as defined in claim 7 wherein at least one of said epitaxial layers includes a ridge member aligned substantially along a direction of propagation for said optical signals.

11. The device as defined in claim 10 further including means for applying an electric field perpendicular to said heterointerface and substantially along a direction of propagation for said optical signals.

12. The device as defined in claim 11 wherein said means for applying an electric field further includes first and second electrodes, said first electrode being disposed on and along said ridge member and second electrode being disposed adjacent to said ridge member and substantially parallel to said first electrode.

* * * * *